US009287838B2

(12) United States Patent
Lin

(10) Patent No.: US 9,287,838 B2
(45) Date of Patent: Mar. 15, 2016

(54) HIGH SLEW RATE OPERATIONAL AMPLIFIER AND OPERATING METHOD THEREOF

(71) Applicant: Raydium Semiconductor Corporation, Hsinchu (TW)

(72) Inventor: Po-Cheng Lin, Hsinchu (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 14/329,737

(22) Filed: Jul. 11, 2014

(65) Prior Publication Data

US 2015/0042404 A1 Feb. 12, 2015

(30) Foreign Application Priority Data

Aug. 6, 2013 (TW) .............................. 102128131 A

(51) Int. Cl.
*H03F 3/45* (2006.01)

(52) U.S. Cl.
CPC .. *H03F 3/45179* (2013.01); *H03F 2203/45248* (2013.01); *H03F 2203/45366* (2013.01)

(58) Field of Classification Search
USPC .................................................. 330/252–261
See application file for complete search history.

(56) References Cited

U.S. PATENT DOCUMENTS 7,863,982 B2 * 1/2011 Chen et al. .................... 330/261

* cited by examiner

*Primary Examiner* — Hieu Nguyen

(57) ABSTRACT

A high slew rate operational amplifier including an input terminal, an output terminal, and at least one slew-rate enhancing circuit is disclosed. Each slew-rate enhancing circuit includes a first stage enhancing unit and a second stage enhancing unit. The first stage enhancing unit is coupled between the input terminal and the output terminal. The first stage enhancing unit and the second stage enhancing unit are coupled. The slew-rate enhancing circuit has a threshold voltage and the threshold voltage is related to the size of the first stage enhancing unit. When the threshold voltage is driven, the slew-rate enhancing circuit will rapidly start the second stage enhancing unit to perform a slew rate compensation on the high slew rate operational amplifier.

8 Claims, 5 Drawing Sheets

HIGH SLEW RATE OPERATIONAL AMPLIFIER AND OPERATING METHOD THEREOF

BACKGROUND OF THE INVENTION

1. Field of the Invention

This invention relates to an operational amplifier, especially to a high slew rate operational amplifier used for analog data transmission in a LCD panel and operating method thereof.

2. Description of the Related Art

With the progress of liquid crystal display technology, panel size and pixel number of the LCD panel are also increased. In order to meet the requirement of the large-size and high-resolution LCD apparatus, a slew rate of an operational amplifier used for analog data transmission in the LCD panel should be also enhanced, so that the user will not see different data transmission rates in different pixels on the LCD panel.

The definition of the so-called "slew rate" is the increased amplitude of voltage in 1 microsecond (ms). Its unit can be V/s, V/ms, or V/μs. As to the operational amplifier, the slew rate is an important parameter to measure the speed of the operational amplifier. The slew rate of the operational amplifier means a capability of the operational amplifier to follow or respond burst signals or pulse signals, namely a transient response capability. If the slew rate of the operational amplifier is slow, a condition of transient inter-modulation distortion will become more serious.

In general, there are two types of conventional high slew rate operational amplifiers: the first type is to directly increase the current source of the operational amplifier, but the static power consumption of entire circuit will be also increased; another type is to use a slew rate enhancement (SRE) circuit.

Please refer to FIG. 1 and FIG. 2. FIG. 1 and FIG. 2 illustrate different types of SRE circuits used in conventional operational amplifier circuits respectively. The conventional operational amplifiers use a first SRE circuit SRE1 of FIG. 1 and a second SRE circuit SRE2 of FIG. 2 to sense input terminals INP and output terminals OUT of the operational amplifier circuits to provide appropriate slew rate compensation to the operational amplifier circuits.

However, since the first SRE circuit SRE1 and the second SRE circuit SRE2 use the threshold voltage of transistor to determine whether to provide slew rate compensation or not, only when the voltage difference between the input terminal INP and output terminal OUT is larger than the threshold voltage of transistor, the first SRE circuit SRE1 and the second SRE circuit SRE2 will be triggered to provide appropriate slew rate compensation to the operational amplifier circuits. This will make the threshold voltages of the first SRE circuit SRE1 and the second SRE circuit SRE2 less flexible to be adjusted. When the change of the data in the operational amplifier circuits is small, the first SRE circuit SRE1 and the second SRE circuit SRE2 would be triggered and then shut down immediately, so that the slew rate of the operational amplifier circuit can be effectively increased.

In addition, there is another drawback of the conventional operational amplifier circuit: if a bulk electrode (a body electrode) and a source electrode of the transistor M1 or M1' comparing the voltages of the input terminal INP and the output terminal OUT fail to be connected, the transistor M1 or M1' will generate a body effect. Therefore, the threshold voltage of the transistor M1 or M1' will be varied with the voltage change of the source electrode, and the threshold voltage used to trigger the SRE circuit will be also changed. Because the threshold voltage used to trigger the SRE circuit is changed, it is hard to provide appropriate slew rate compensation to the operational amplifier circuit. And, the conventional first SRE circuit SRE1 and second SRE circuit SRE2 only use one stage slew rate enhancement to drive the operational amplifier circuit, its slew rate compensation speed is too slow to meet nowadays requirements.

SUMMARY OF THE INVENTION

Therefore, the invention provides a high slew rate operational amplifier used for analog data transmission in a LCD panel and operating method thereof to solve the above-mentioned problems occurred in the prior arts.

A scope of the invention is to provide a high slew rate operational amplifier. In the high slew rate operational amplifier, not only the threshold voltage used to trigger the slew rate enhancement circuit can be flexibly adjusted to enhance the activation speed of the slew rate enhancement circuit, but also two stage slew rate enhancement is used to drive the high slew rate operational amplifier to provide faster and larger driving capability to increase the slew rate of the high slew rate operational amplifier.

An embodiment of the invention is a high slew rate operational amplifier. In this embodiment, the high slew rate operational amplifier includes an input terminal, an output terminal, and at least one slew-rate enhancing circuit. Each slew-rate enhancing circuit includes a first stage enhancing unit and a second stage enhancing unit. The first stage enhancing unit is coupled between the input terminal and the output terminal. The first stage enhancing unit and the second stage enhancing unit are coupled. The slew-rate enhancing circuit has a threshold voltage and the threshold voltage is related to the size of the first stage enhancing unit. When the threshold voltage is driven, the slew-rate enhancing circuit will rapidly start the second stage enhancing unit to perform a slew rate compensation on the high slew rate operational amplifier.

In an embodiment, the first stage enhancing unit includes a first transistor and a second transistor. The first transistor and the second transistor are coupled to the input terminal and the output terminal respectively. The second stage enhancing unit includes a third transistor coupled to the first transistor.

In an embodiment, the first stage enhancing unit further includes a fourth transistor, a fifth transistor, and a sixth transistor. The fourth transistor and the fifth transistor are coupled. The fourth transistor is coupled to the first transistor and the third transistor. The fifth transistor is coupled to the second transistor. The sixth transistor is coupled to the first transistor, the second transistor, and a ground terminal.

In an embodiment, the first transistor, the second transistor, and the sixth transistor are N-type MOSFETs and the third transistor, the fourth transistor, and the fifth transistor are P-type MOSFETs.

In an embodiment, the first transistor, the second transistor, and the sixth transistor are P-type MOSFETs and the third transistor, the fourth transistor, and the fifth transistor are N-type MOSFETs.

In an embodiment, the threshold voltage is related to sizes of the first transistor and the second transistor of the first stage enhancing unit.

Another scope of the invention is to provide a high slew rate operational amplifier operating method. Another embodiment of the invention is a high slew rate operational amplifier operating method. In this embodiment, the high slew rate operational amplifier operating method is used to operate a high slew rate operational amplifier. The high slew rate operational amplifier includes an input terminal, an output terminal, and at least one slew-rate enhancing circuit. A slew-rate enhancing circuit of the at least one slew-rate enhancing circuit includes a first stage enhancing unit and a second stage enhancing unit. The slew-rate enhancing circuit has a threshold voltage and the threshold voltage is related to a size of the first stage enhancing unit. The high slew rate operational amplifier operating method includes steps of: (a) coupling the first stage enhancing unit between the input terminal and the output terminal and coupling the second stage enhancing unit to the first stage enhancing unit; and (b) when the slew-rate enhancing circuit is driven by the threshold voltage, the slew-rate enhancing circuit rapidly activating the second stage enhancing unit to perform a slew rate compensation on the high slew rate operational amplifier.

Compared to the prior art, the high slew rate operational amplifier and operating method thereof in the invention are used for analog data transmission in a LCD panel and have features of flexibly adjusting the threshold voltage used to trigger the slew rate enhancement circuit to enhance the activation speed of the slew rate enhancement circuit and using two stage slew rate enhancement to drive the high slew rate operational amplifier, so that faster and larger driving capability can be provided to increase the slew rate of the high slew rate operational amplifier.

The advantage and spirit of the invention may be understood by the following detailed descriptions together with the appended drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

A preferred embodiment of the invention is a high slew rate operational amplifier. In this embodiment, the high slew rate operational amplifier can not only flexibly adjust the threshold voltage used to trigger the slew rate enhancement circuit to enhance the activation speed of the slew rate enhancement circuit, but also use two stage slew rate enhancement to drive the high slew rate operational amplifier, so that faster and larger driving capability can be provided to increase the slew rate of the high slew rate operational amplifier.

Figure 3:
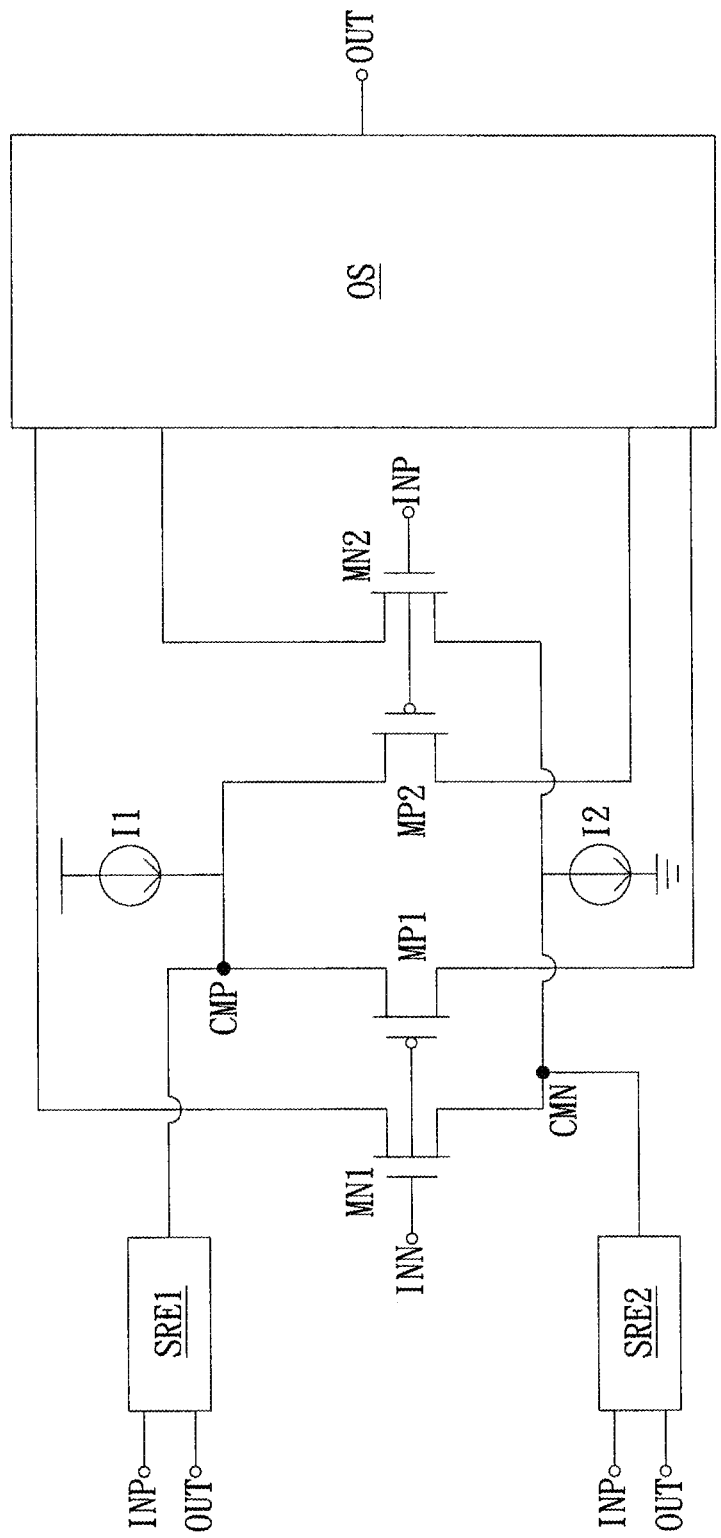
FIG. 3 illustrates an operational amplifier circuit in an embodiment of the invention.

Please refer to FIG. 3. FIG. 3 illustrates the operational amplifier circuit in this embodiment. As shown in FIG. 3, the high slew rate operational amplifier includes input terminals INP and INN, an output terminal OUT, current sources 11 and 12, P-type transistors MP1 and MP2, N-type transistors MN1 and MN2, an output stage OS, and slew rate enhancement circuits SRE1 and SRE2. Wherein, two terminals of the P-type transistor MP1 are coupled to a node CMP and the output stage OS respectively; two terminals of the P-type transistor MP2 are coupled to the node CMP and the output stage OS respectively; two terminals of the N-type transistor MN1 are coupled to a node CMN and the output stage OS respectively; two terminals of the N-type transistor MN2 are coupled to the node CMN and the output stage OS respectively; the current source 11 is coupled to the node CMP; the current source 12 is coupled between the node CMN and the ground terminal; the slew rate enhancement circuit SRE1 is coupled to the input terminal INP, the output terminal OUT, and the node CMP; the slew rate enhancement circuit SRE2 is coupled to the input terminal INP, the output terminal OUT, and the node CMN; the N-type transistor MN1 and the P-type transistor MP1 are coupled to the input terminal INN; the N-type transistor MN2 and the P-type transistor MP2 are coupled to the input terminal INP; the output stage OS is coupled to the output terminal OUT.

Figure 4:
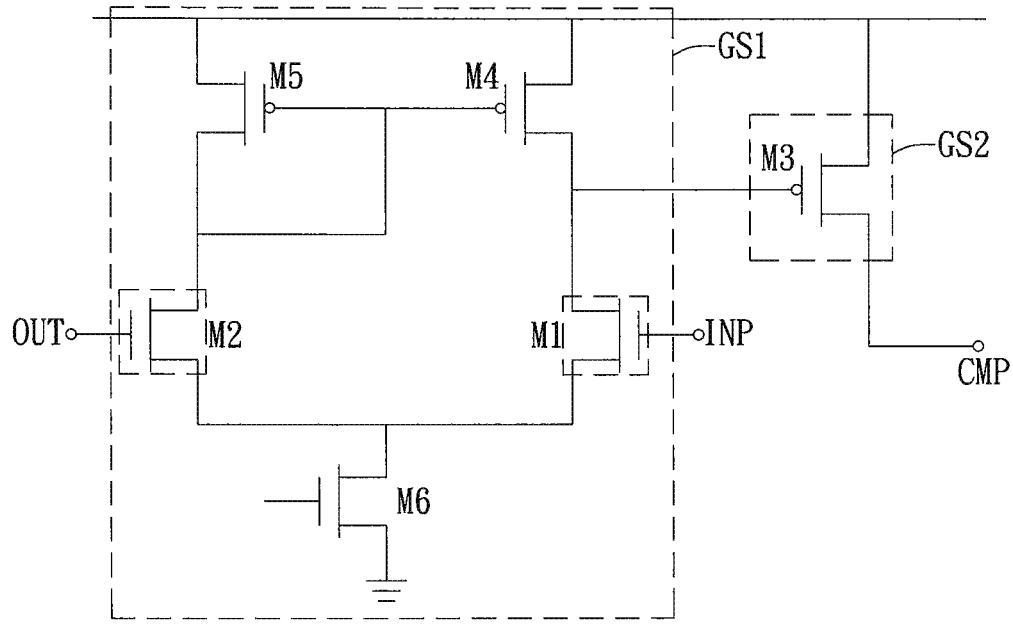
FIG. 4 illustrates an embodiment of the first slew rate enhancement circuit in the operational amplifier circuit shown in FIG. 3.

Please refer to FIG. 4. FIG. 4 illustrates an embodiment of the first slew rate enhancement circuit SRE1 in the operational amplifier circuit shown in FIG. 3. It should be noticed that the circuit structure of FIG. 4 is only one possible embodiment of the first slew rate enhancement circuit SRE1, not limited to this. As shown in FIG. 4, the first slew rate enhancement circuit SRE1 includes a first stage enhancing unit GS1 and a second stage enhancing unit GS2. Wherein, the first stage enhancing unit GS1 includes transistors M1, M2, M4, M5, and M6, and the transistors M1, M2, and M6 are N-type transistors and the transistors M4 and M5 are P-type transistors; the second stage enhancing unit GS2 includes a transistor M3, and the transistor M3 is P-type transistor. The first stage enhancing unit GS1 and the second stage enhancing unit GS2 are coupled. In fact, the P-type transistors can be P-type MOSFETs; the N-type transistors can be N-type MOSFETs.

The transistor M1 is coupled between the transistor M4 and the transistor M6 and the gate terminal of the transistor M1 is coupled to the input terminal INP; the transistor M2 is coupled between the transistor M5 and the transistor M6 and the gate terminal of the transistor M2 is coupled to the output terminal OUT; one terminal of the transistor M3 is coupled to one terminal of the transistors M4 and M5 and another terminal of the transistor M3 is coupled to the node CMP, and the gate terminal of the transistor M3 is coupled between the transistors M1 and M4; the gate terminal of the transistor M4 is coupled to the gate of the transistor M5 and to the node between the transistors M5 and M2; the transistor M6 is coupled to the transistors M1 and M2 and the ground terminal.

It should be noticed that the first slew rate enhancement circuit SRE1 has a threshold voltage related to the size of the first stage enhancing unit GS1. In detail, the threshold voltage of the first slew rate enhancement circuit SRE1 relates to the sizes of the transistors M1 and M2 in the first stage enhancing unit GS1. Therefore, the threshold voltage of the first slew rate enhancement circuit SRE1 can be adjusted based on practical needs by changing the sizes of the transistors M1 and M2 in the first stage enhancing unit GS1, and the first slew rate enhancement circuit SRE1 can be driven even the data change amount is not large enough. In addition, the body effect acted on the first slew rate enhancement circuit SRE1 can be reduced, so that the threshold voltage will be not changed due to different input voltages of the input terminal INP. When the first slew rate enhancement circuit SRE1 is driven by the threshold voltage, the first slew rate enhancement circuit SRE1 will rapidly activate the second stage enhancing unit GS2 to provide appropriate slew rate compensation to the operational amplifier.

Figure 5:
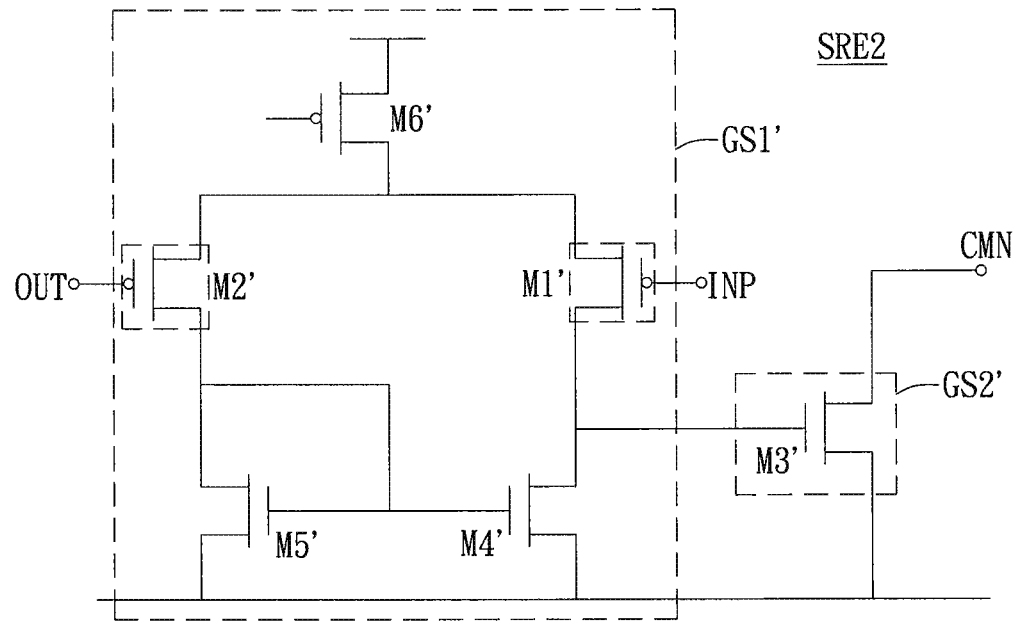
FIG. 5 illustrates an embodiment of the second slew rate enhancement circuit in the operational amplifier circuit shown in FIG. 3.

Please refer to FIG. 5. FIG. 5 illustrates an embodiment of the second slew rate enhancement circuit SRE2 in the operational amplifier circuit shown in FIG. 3. It should be noticed that the circuit structure of FIG. 5 is only one possible embodiment of the second slew rate enhancement circuit SRE2, but not limited to this. As shown in FIG. 5, the second slew rate enhancement circuit SRE2 includes a first stage enhancing unit GS1' and a second stage enhancing unit GS2'. Wherein, the first stage enhancing unit GS1' includes transistors M1', M2', M4', M5', and M6', and the transistors M1', M2', and M6' are P-type transistors and the transistors M4' and M5' are N-type transistors; the second stage enhancing unit GS2' includes a transistor M3', and the transistor M3' is N-type transistor. The first stage enhancing unit GS1' and the second stage enhancing unit GS2' are coupled. In fact, the P-type transistors can be P-type MOSFETs; the N-type transistors can be N-type MOSFETs.

The transistor M1' is coupled between the transistor M4' and the transistor M6' and the gate terminal of the transistor M1' is coupled to the input terminal INP; the transistor M2' is coupled between the transistor M5' and the transistor M6' and the gate terminal of the transistor M2' is coupled to the output terminal OUT; one terminal of the transistor M3' is coupled to one terminal of the transistors M4' and M5' and another terminal of the transistor M3' is coupled to the node CMN, and the gate terminal of the transistor M3' is coupled between the transistors M1' and M4'; the gate terminal of the transistor M4' is coupled to the gate of the transistor M5' and to the node between the transistors M5' and M2'; the transistor M6' is coupled to the transistors M1' and M2'.

It should be noticed that the second slew rate enhancement circuit SRE2 also has a threshold voltage related to the size of the first stage enhancing unit GS1'. In detail, the threshold voltage of the second slew rate enhancement circuit SRE2 relates to the sizes of the transistors M1' and M2' in the first stage enhancing unit GS1'. Therefore, the threshold voltage of the second slew rate enhancement circuit SRE2 can be adjusted based on practical needs by changing the sizes of the transistors M1' and M2' in the first stage enhancing unit GS1', and the second slew rate enhancement circuit SRE2 can be driven even the data change amount is not large enough. In addition, the body effect acted on the second slew rate enhancement circuit SRE2 can be reduced, so that the threshold voltage will be not changed due to different input voltages of the input terminal INP. When the second slew rate enhancement circuit SRE2 is driven by the threshold voltage, the second slew rate enhancement circuit SRE2 will rapidly activate the second stage enhancing unit GS2' to provide appropriate slew rate compensation to the operational amplifier.

Figure 1:
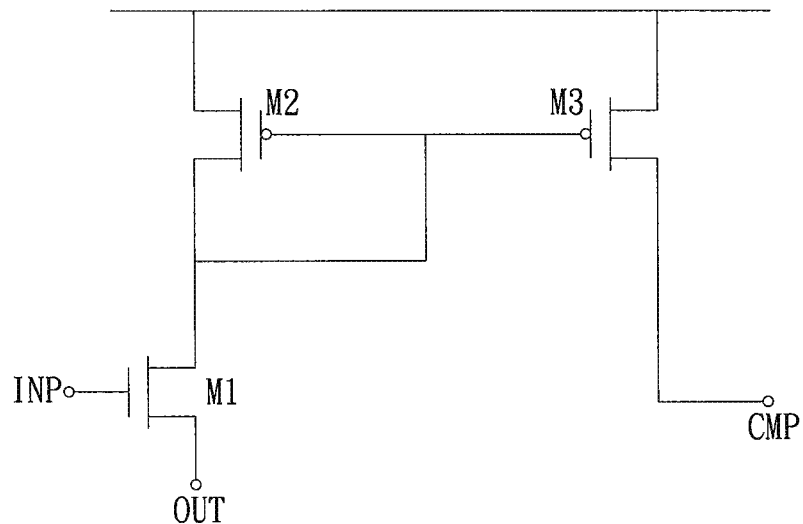
FIG. 1 illustrates a first slew rate enhancement circuit of the conventional operational amplifier circuit.
Figure 2:
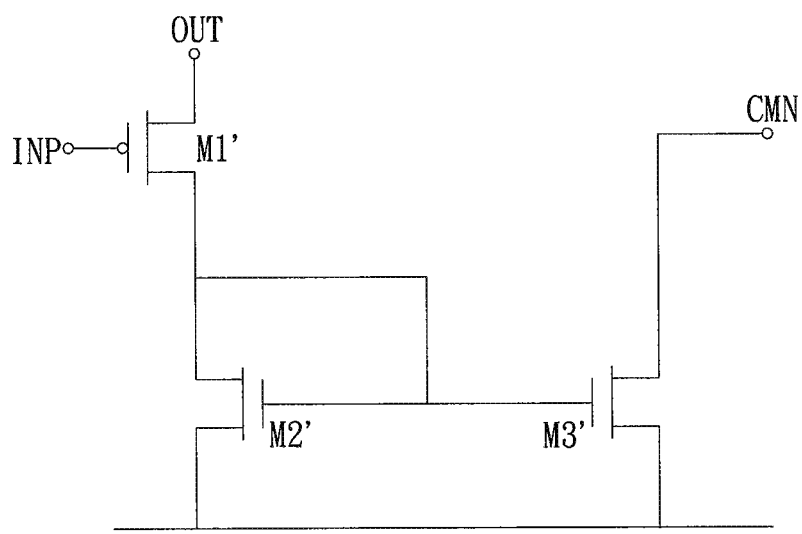
FIG. 2 illustrates a second slew rate enhancement circuit of the conventional operational amplifier circuit.
Figure 6:
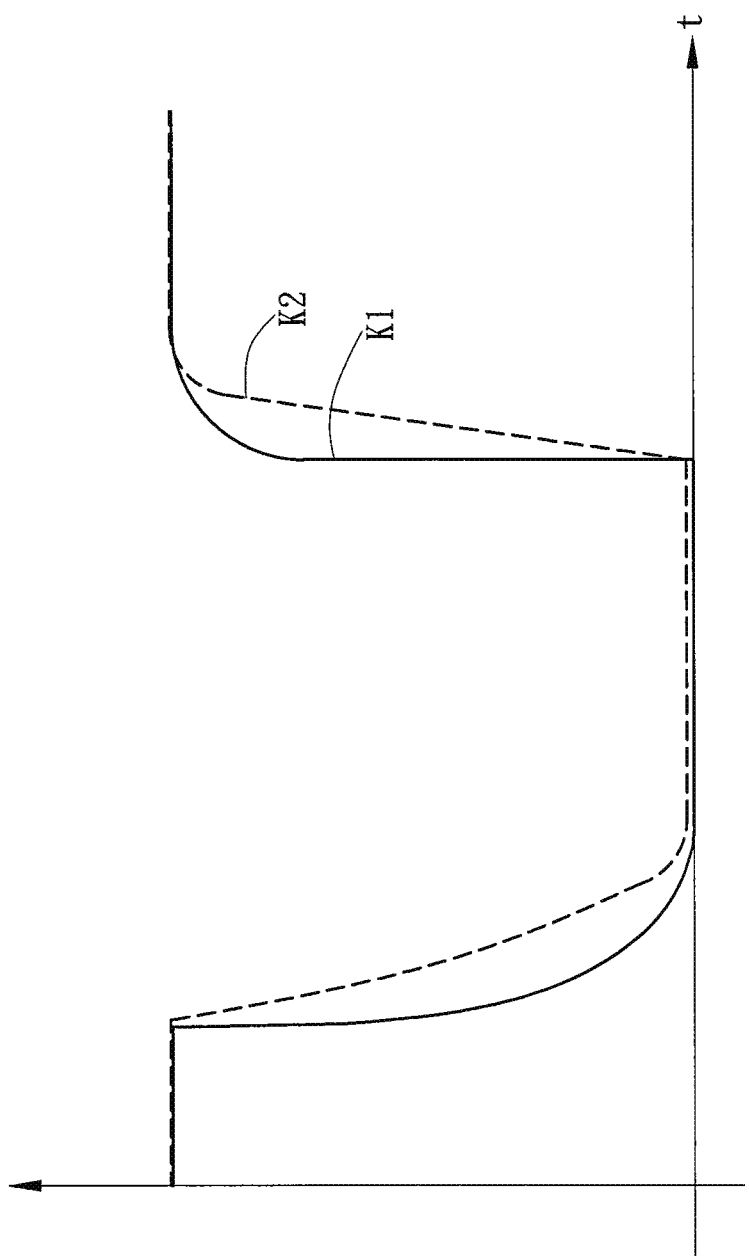
FIG. 6 illustrates a slew rates comparison between the operational amplifier circuits of prior art and the invention.

Please refer to FIG. 6. FIG. 6 illustrates a slew rates comparison between the operational amplifier circuits of prior art and the invention. As shown in FIG. 6, K1 represents a first slew rate curve obtained by the operational amplifier circuit of the invention using the slew rate enhancement circuits SRE1 and SRE2 shown in FIG. 4 and FIG. 5; K2 represents a second slew rate curve obtained by the operational amplifier circuit of the prior art using the slew rate enhancement circuits shown in FIG. 1 and FIG. 2. Since the slope of the first slew rate curve K1 is steeper than that of the second slew rate curve K2, it is believed that the slew rate of the operational amplifier circuit of the invention is larger than that of the operational amplifier circuit of the prior art.

Another embodiment of the invention is a high slew rate operational amplifier operating method. In this embodiment, the high slew rate operational amplifier operating method is used to operate a high slew rate operational amplifier. The high slew rate operational amplifier includes an input terminal, an output terminal, and at least one slew-rate enhancing circuit. A slew-rate enhancing circuit of the at least one slew-rate enhancing circuit includes a first stage enhancing unit and a second stage enhancing unit. The slew-rate enhancing circuit has a threshold voltage and the threshold voltage is related to a size of the first stage enhancing unit. This is because that the operational amplifier circuit of the invention can flexibly adjust the threshold voltage used to trigger the slew rate enhancement circuit to enhance the activation speed of the slew rate enhancement circuit and use two stage slew rate enhancement to drive the high slew rate operational amplifier, so that faster and larger driving capability can be provided to increase the slew rate of the high slew rate operational amplifier.

Figure 7:
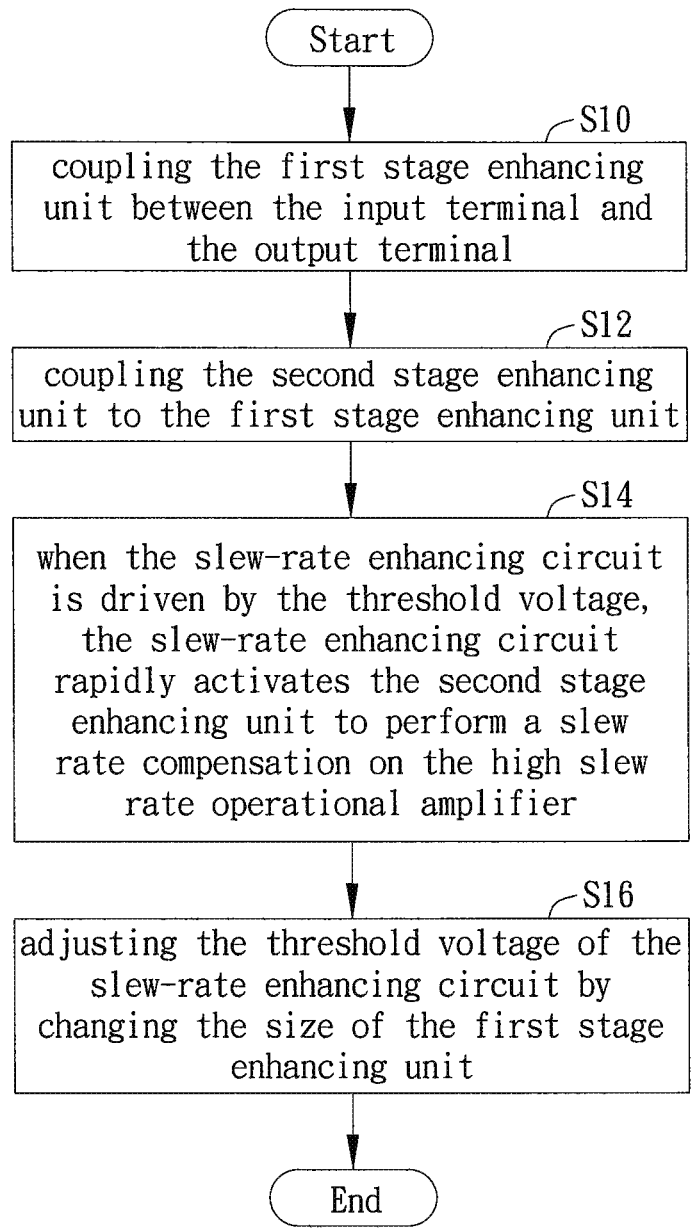
FIG. 7 illustrates a flow chart of the high slew rate operational amplifier operating method in another embodiment of the invention.

Please refer to FIG. 7. FIG. 7 illustrates a flow chart of the high slew rate operational amplifier operating method in another embodiment of the invention. As shown in FIG. 7, in the step S10, the method couples the first stage enhancing unit between the input terminal and the output terminal. In the step S12, the method couples the second stage enhancing unit to the first stage enhancing unit. In the step S14, when the slew-rate enhancing circuit is driven by the threshold voltage, the slew-rate enhancing circuit rapidly activates the second stage enhancing unit to perform a slew rate compensation on the high slew rate operational amplifier. In fact, the method can also perform the step S16 to adjust the threshold voltage of the slew-rate enhancing circuit by changing the size of the first stage enhancing unit. As to the details of the operations and structures of the first stage enhancing unit and the second stage enhancing unit, please refer to the above-mentioned embodiments.

Compared to the prior art, the high slew rate operational amplifier and operating method thereof in the invention are used for analog data transmission in a LCD panel and have features of flexibly adjusting the threshold voltage used to trigger the slew rate enhancement circuit to enhance the activation speed of the slew rate enhancement circuit and using two stage slew rate enhancement to drive the high slew rate operational amplifier, so that faster and larger driving capability can be provided to increase the slew rate of the high slew rate operational amplifier.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

The invention claimed is:

1. A high slew rate operational amplifier, comprising:
   an input terminal;
   an output terminal; and
   at least one slew-rate enhancing circuit, a slew-rate enhancing circuit of the at least one slew-rate enhancing circuit comprising a first stage enhancing unit and a second stage enhancing unit, wherein the first stage enhancing unit is coupled between the input terminal and the output terminal, the first stage enhancing unit and the second stage enhancing unit are coupled, the slew-rate enhancing circuit has a threshold voltage and the threshold voltage is related to a size of the first stage enhancing unit, when the slew-rate enhancing circuit is driven by the threshold voltage, the slew-rate enhancing circuit rapidly activates the second stage enhancing unit to perform a slew rate compensation on the high slew rate operational amplifier;

wherein the first stage enhancing unit comprises a first transistor and a second transistor, the first transistor and the second transistor are coupled to the input terminal and the output terminal respectively, the second stage enhancing unit comprises a third transistor coupled to the first transistor, the first stage enhancing unit further comprises a fourth transistor, a fifth transistor, and a sixth transistor, the fourth transistor and the fifth transistor are coupled, the fourth transistor is coupled to the first transistor and the third transistor, the fifth transistor is coupled to the second transistor, the sixth transistor is coupled to the first transistor, the second transistor, and a ground terminal.

2. The high slew rate operational amplifier of claim 1, wherein the first transistor, the second transistor, and the sixth transistor are N-type MOSFETs and the third transistor, the fourth transistor, and the fifth transistor are P-type MOSFETs.

3. The high slew rate operational amplifier of claim 1, wherein the first transistor, the second transistor, and the sixth transistor are P-type MOSFETs and the third transistor, the fourth transistor, and the fifth transistor are N-type MOSFETs.

4. The high slew rate operational amplifier of claim 1, wherein the threshold voltage is related to sizes of the first transistor and the second transistor of the first stage enhancing unit.

5. A high slew rate operational amplifier operating method, for operating a high slew rate operational amplifier, the high slew rate operational amplifier comprising an input terminal, an output terminal, and at least one slew-rate enhancing circuit, a slew-rate enhancing circuit of the at least one slew-rate enhancing circuit comprising a first stage enhancing unit and a second stage enhancing unit, the slew-rate enhancing circuit having a threshold voltage and the threshold voltage being related to a size of the first stage enhancing unit, the high slew rate operational amplifier operating method comprising steps of:

(a) coupling the first stage enhancing unit between the input terminal and the output terminal and coupling the second stage enhancing unit to the first stage enhancing unit; and (b) when the slew-rate enhancing circuit is driven by the threshold voltage, the slew-rate enhancing circuit rapidly activating the second stage enhancing unit to perform a slew rate compensation on the high slew rate operational amplifier;

wherein the first stage enhancing unit comprises a first transistor and a second transistor, the first transistor and the second transistor are coupled to the input terminal and the output terminal respectively, the second stage enhancing unit comprises a third transistor coupled to the first transistor, the first stage enhancing unit further comprises a fourth transistor, a fifth transistor, and a sixth transistor, the fourth transistor and the fifth transistor are coupled, the fourth transistor is coupled to the first transistor and the third transistor, the fifth transistor is coupled to the second transistor, the sixth transistor is coupled to the first transistor, the second transistor, and a ground terminal.

6. The high slew rate operational amplifier operating method of claim 5, wherein the first transistor, the second transistor, and the sixth transistor are N-type MOSFETs and the third transistor, the fourth transistor, and the fifth transistor are P-type MOSFETs.

7. The high slew rate operational amplifier operating method of claim 5, wherein the first transistor, the second transistor, and the sixth transistor are P-type MOSFETs and the third transistor, the fourth transistor, and the fifth transistor are N-type MOSFETs.

8. The high slew rate operational amplifier operating method of claim 5, wherein the threshold voltage is related to sizes of the first transistor and the second transistor of the first stage enhancing unit.

* * * * *